United States Patent
Louie et al.

(10) Patent No.: US 7,852,681 B2
(45) Date of Patent: Dec. 14, 2010

(54) NON-VOLATILE ONE TIME PROGRAMMABLE MEMORY

(75) Inventors: Benjamin Louie, Fremont, CA (US); Ebrahim Abedifard, Sunnyvale, CA (US)

(73) Assignee: Micron Technology, Inc., Boise, ID (US)

( * ) Notice: Subject to any disclaimer, the term of this patent is extended or adjusted under 35 U.S.C. 154(b) by 51 days.

(21) Appl. No.: 12/426,689

(22) Filed: Apr. 20, 2009

(65) Prior Publication Data
US 2009/0207665 A1 Aug. 20, 2009

Related U.S. Application Data

(60) Continuation of application No. 11/600,356, filed on Nov. 16, 2006, now Pat. No. 7,532,517, which is a division of application No. 10/933,205, filed on Sep. 2, 2004, now Pat. No. 7,239,552.

(51) Int. Cl.
*G11C 11/34* (2006.01)
(52) U.S. Cl. .................. 365/185.22; 365/185.29; 365/195

(58) Field of Classification Search ............ 365/185.22, 365/195, 185.29
See application file for complete search history.

(56) References Cited

U.S. PATENT DOCUMENTS

| | | | |
|---|---|---|---|
| 4,783,745 A | 11/1988 | Brookner | |
| 6,031,757 A | 2/2000 | Chuang | |
| 6,073,243 A * | 6/2000 | Dalvi et al. | 726/21 |
| 6,188,602 B1 | 2/2001 | Alexander | |
| 6,275,419 B1 | 8/2001 | Guterman | |
| 6,292,012 B1 | 9/2001 | Yeh | |
| 6,557,104 B2 | 4/2003 | Vu | |
| 6,651,088 B1 | 11/2003 | Zhang | |
| 6,665,214 B1 | 12/2003 | Cheah | |
| 6,671,785 B2 * | 12/2003 | Dalvi et al. | 711/154 |
| 6,681,297 B2 | 1/2004 | Chauvel | |
| 2004/0052110 A1 | 3/2004 | Nguyen | |

* cited by examiner

*Primary Examiner*—Son Dinh
(74) *Attorney, Agent, or Firm*—Leffert Jay & Polglaze, P.A.

(57) ABSTRACT

A verify operation is performed on the one time programmable memory block to determine if it has been programmed. If any bits have been programmed, further programming or erasing is inhibited. In another embodiment, the memory block can be programmed and erased until a predetermined page or lock bit in the block is programmed. Once that page/bit is programmed, the one time programmable memory block is locked against further programming or erasing.

20 Claims, 4 Drawing Sheets

NON-VOLATILE ONE TIME PROGRAMMABLE MEMORY

RELATED APPLICATIONS

This is a continuation of U.S. application Ser. No. 11/600,356, titled "NON-VOLATILE ONE TIME PROGRAMMABLE MEMORY", filed Nov. 16, 2006 now U.S. Pat. No. 7,532,517 (allowed), which is a divisional application of 10/933,205 filed Sep. 2, 2004 now U.S. Pat. No. 7,239,552, titled "NON-VOLATILE ONE TIME PROGRAMMABLE MEMORY," issued Jul. 3, 2007, which are assigned to the assignee of the present invention and the entire contents of which are incorporated herein by reference.

TECHNICAL FIELD OF THE INVENTION

The present invention relates generally to memory devices and in particular the present invention relates to flash memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

Flash memory devices can have areas of memory that are one time programmable (OTP) memory blocks. For example, in a NOR-type flash memory device, the OTP area could be the mini-array that is used by the manufacturer to store data such as the locations of redundant columns, lock bits for specific memory blocks, or other data used by the device's controller.

These mini-arrays, however, take up valuable real estate on the memory die that can be used for the main memory array. This results in an additional cost to the chip manufacturer when the manufacturer is already selling the devices at a small profit margin in order to remain competitive.

For the reasons stated above, and for other reasons stated below which will become apparent to those skilled in the art upon reading and understanding the present specification, there is a need in the art for a flash memory that has one time programmable memory that does not require additional lock circuitry.

DETAILED DESCRIPTION

Figure 1:
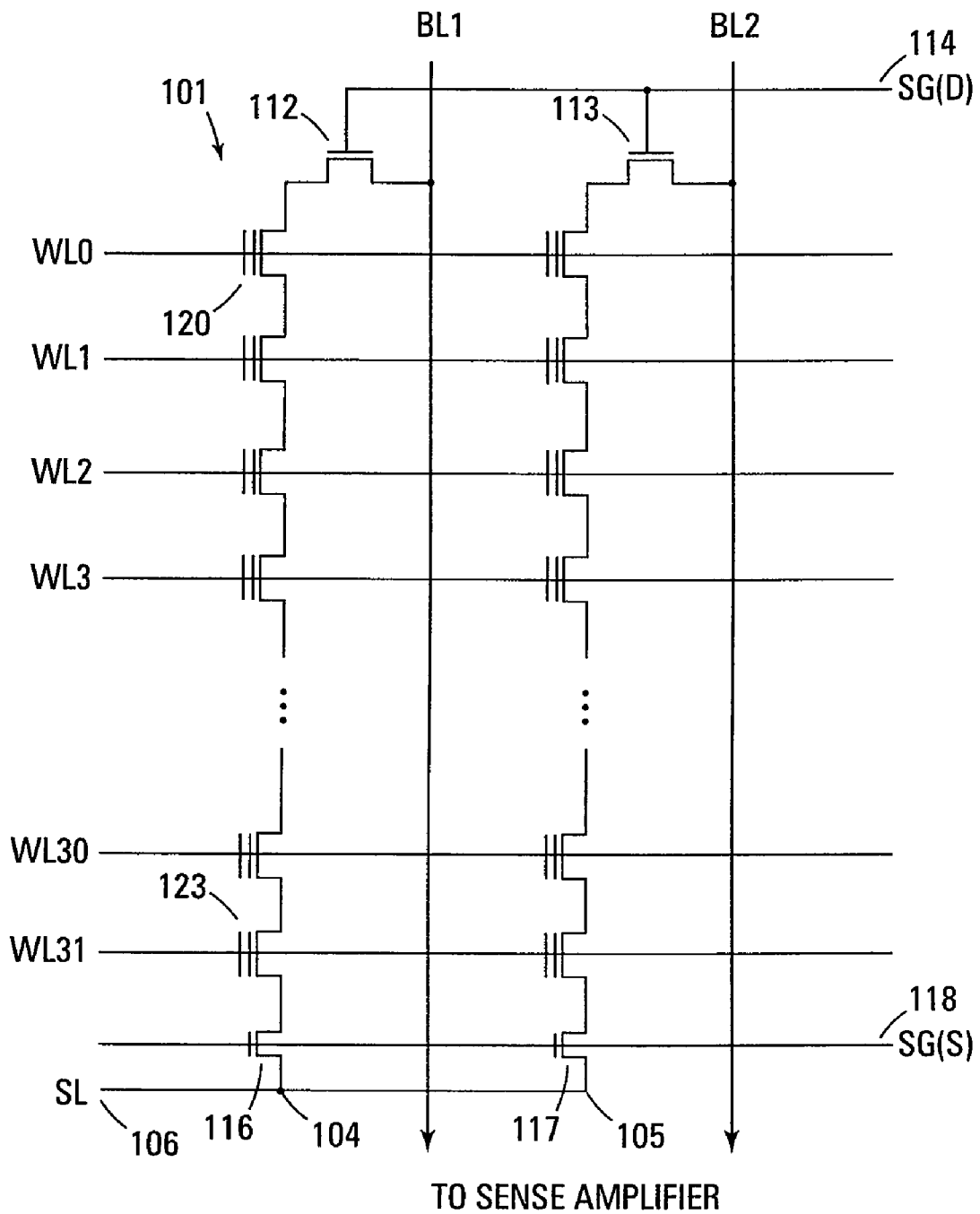
FIG. 1 shows a simplified diagram of one embodiment of a NAND flash memory array architecture of the present invention.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

While the subsequently described embodiments refer to a NAND flash memory device, the present invention is not limited to such an architecture. The present invention can be implemented in NOR or other types of non-volatile memory configurations.

FIG. 1 illustrates a simplified diagram of one embodiment for a NAND flash memory array of the present invention. The memory array of FIG. 1, for purposes of clarity, does not show all of the elements typically required in a memory array. For example, only two bitlines are shown (BL1 and BL2) when the number of bitlines required actually depends upon the memory density. The bitlines are subsequently referred to as (BL1-BLN).

The array is comprised of an array of floating gate cells 101 arranged in series strings 104, 105. Each of the floating gate cells 101 are coupled drain to source in each series chain 104, 105. A word line (WL0-WL31) that spans across multiple series strings 104, 105 is coupled to the control gates of every floating gate cell in a row in order to control their operation. The bitlines (BL1-BLN) are eventually coupled to sense amplifiers (not shown) that detect the state of each cell.

In operation, the wordlines (WL0-WL31) select the individual floating gate memory cells in the series chain 104, 105 to be written to or read from and operate the remaining floating gate memory cells in each series string 104, 105 in a pass through mode. Each series string 104, 105 of floating gate memory cells is coupled to a source line 106 by a source select gate 116, 117 and to an individual bitline (BL1-BLN) by a drain select gate 112, 113. The source select gates 116, 117 are controlled by a source select gate control line SG(S) 118 coupled to their control gates. The drain select gates 112, 113 are controlled by a drain select gate control line SG(D) 114.

Each cell can be programmed as a single bit per cell (SBC) or multiple bits per cell (i.e., multilevel cell—MLC). Each cell's threshold voltage ($V_t$) determines the data that is stored in the cell. For example, in a single bit per cell, a $V_t$ of 0.5V might indicate a programmed cell while a $V_t$ of −0.5V might indicate an erased cell. The multilevel cell may have multiple $V_t$ windows that each indicate a different state. Multilevel cells take advantage of the analog nature of a traditional flash cell by assigning a bit pattern to a specific voltage range stored on the cell. This technology permits the storage of two or more bits per cell, depending on the quantity of voltage ranges assigned to the cell.

During a typical prior art programming operation, the selected wordline for the flash memory cell to be programmed is biased with a programming pulse at a voltage that is greater than 16V. A verification operation with a wordline voltage of 0V is then performed to determine if the floating gate is at the proper voltage (e.g., 0.5V). The unselected wordlines for the remaining cells are typically biased at approximately 10V during the program operation. Each of the memory cells is programmed in a substantially similar fashion.

In a NOR configuration, the cells are arranged in a matrix. The gates of each floating gate memory cell of the array matrix are connected by rows to wordlines and their drains are connected to column bitlines. The source of each floating gate memory cell is typically connected to a common source line. Still other embodiments can use other architectures.

The above-described NAND and NOR flash memory configurations are arranged into memory arrays that are typically broken down into memory subsets referred to as memory blocks. Some of the memory blocks may be designated as one time programmable (OTP) blocks so that the memory device user can program data into these blocks for permanent storage. For example, a manufacturer of a cellular telephone may program telephone and system identification information into these blocks so that the consumer cannot change the information. A memory device manufacture might have one particular block of memory that is designated as an OTP block.

Figure 2:
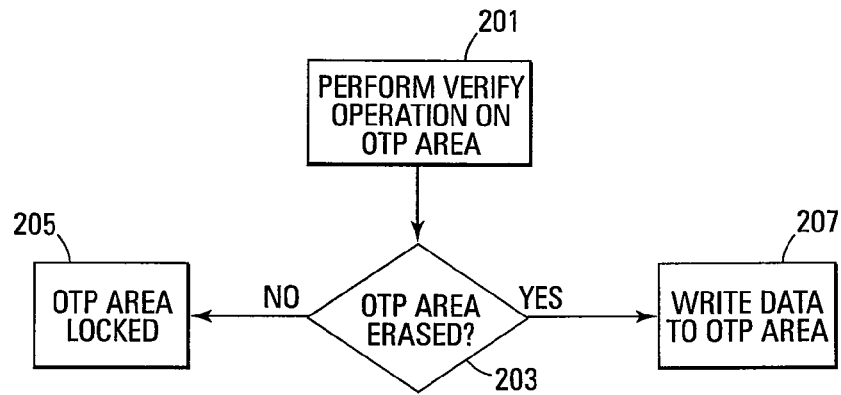
FIG. 2 shows a flowchart of one embodiment of a method of the present invention for programming one time programmable memory.

FIG. 2 illustrates a flowchart of one embodiment of a method of the present invention for programming OTP memory blocks without using a lock bit. This method uses a verify operation to determine if any of the OTP blocks have been programmed. In one embodiment, the verify operation is substantially similar to an erase verify operation. Since an erased memory block is all logical ones, the verify operation looks for a logical zero to determine that data has been written to the OTP area. In an alternate embodiment, an erased condition might be all logical zeros. In this case, the verify operation looks for a logical one to determine that data has been written to the OTP area.

When it is desired to write data to the OTP area, a verify operation is performed on the entire OTP block 201. If any data has been written to the area 203, the block is locked 205 to any further programming. If the OTP block is erased 203, data can be written to the area 207. Once the data has been written, the OTP block is now considered locked.

Figure 3:
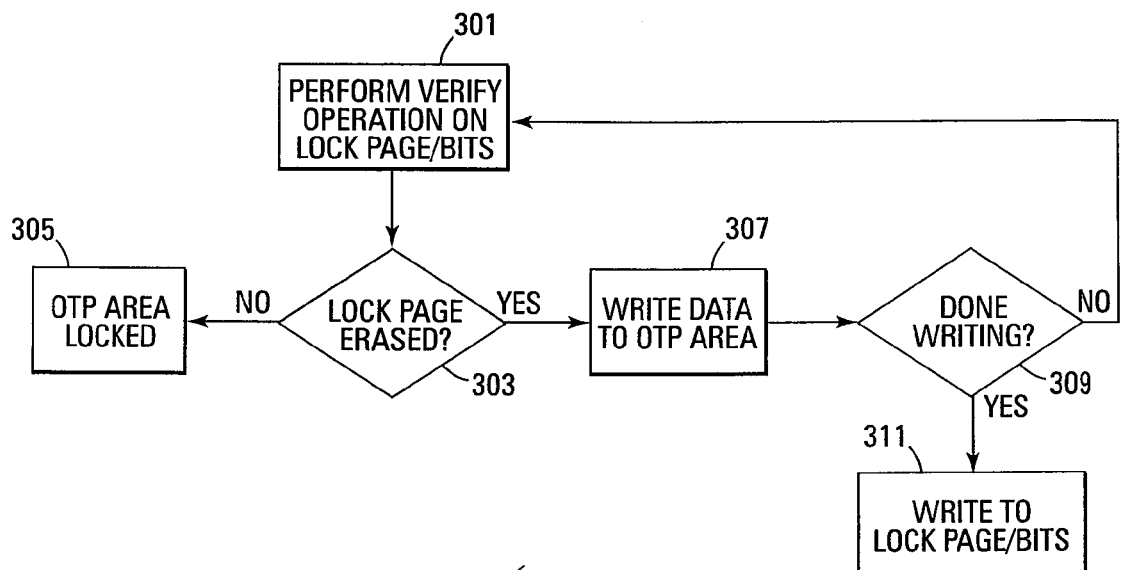
FIG. 3 shows a flowchart of an alternate embodiment of a method of the present invention for programming one time programmable memory.

FIG. 3 illustrates a flowchart of an alternate embodiment of the present invention for programming OTP memory blocks. This embodiment uses a lock bit or lock page to indicate when the OTP block is locked to further programming. In the alternate embodiment, the OTP block can be written to as many times as desired until the memory is locked. The lock bit or lock page can be located in any memory block of the memory device. The embodiments of the present invention do not require the lock bit or lock page to be in the same block as the OTP block.

Initially, a verify operation may be performed on the lock page or lock bits to determine if they have been programmed 301. In one embodiment, an entire page of memory (e.g., 16k bits) is used as a lock page. When any one bit of the page (e.g., page 0) has been programmed with any data, the entire OTP block is locked. The programmed address and the data written is not important as long as the verify operation can determine that data has been programmed. Alternate embodiments can use other pages of the OTP block to perform as lock pages. For example, a user space block or a redundant memory block may be used. In still other embodiments, particular bits of a lock page or a particular lock pattern may be used to lock the OTP block. For example, a logical "1010" sequence might be programmed into page 0 in order to lock the OTP block. When this sequence is detected during the verify operation, the OTP block is considered locked.

If there is data programmed into the lock page or lock bits 303, the OTP memory block is locked from further programming 305. If there are no programmed bits in the lock page 303, the OTP block has not been locked and data can be written to this area 307. When the user is done writing data 309 and desires to lock the OTP area, data is programmed into the lock page 311 or the lock bits of the page are programmed. If it is not desired to lock the OTP block 309, data can be subsequently written to and/or erased from the OTP block until the lock page/bits have been programmed.

The embodiments of FIGS. 2 and 3 refer to the OTP area as being a memory block. However, alternate embodiments can use the methods of the present invention to lock multiple memory blocks or even an entire memory device. The size of memory to be locked is not limited by the present invention.

Figure 4:
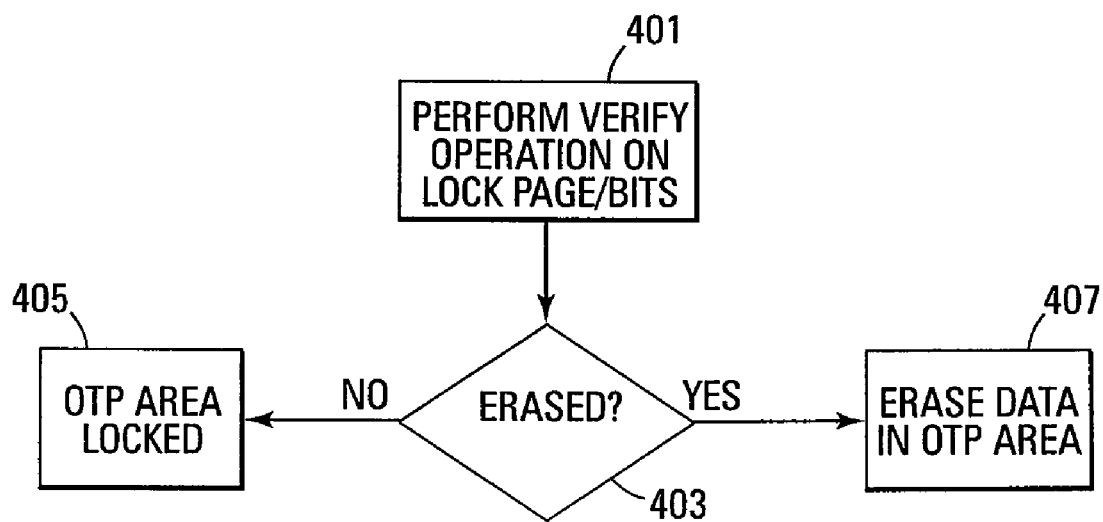
FIG. 4 shows a flowchart of one embodiment of a method of the present invention for erasing one time programmable memory.

FIG. 4 illustrates a flowchart of one embodiment for locking an OTP area from being erased. Since it is typically desirable that an OTP memory block not be changed in any way once it is programmed as desired, this method provides a user with the ability to keep others from erasing the OTP memory. In one embodiment, this method is part of the embodiments of the above-described method for locking the OTP area. In an alternate embodiment, the erase inhibit method is executed as a stand-alone method.

The verify operation is performed 401 on the lock page or the lock bits, depending on the embodiment used. If the page/bits is erased 403, the OTP area is considered unlocked and can be erased 407. If the page/bits have been programmed in some way or if the lock pattern is present, again depending on the embodiment, the OTP is locked and an erase operation is prevented.

Figure 5:
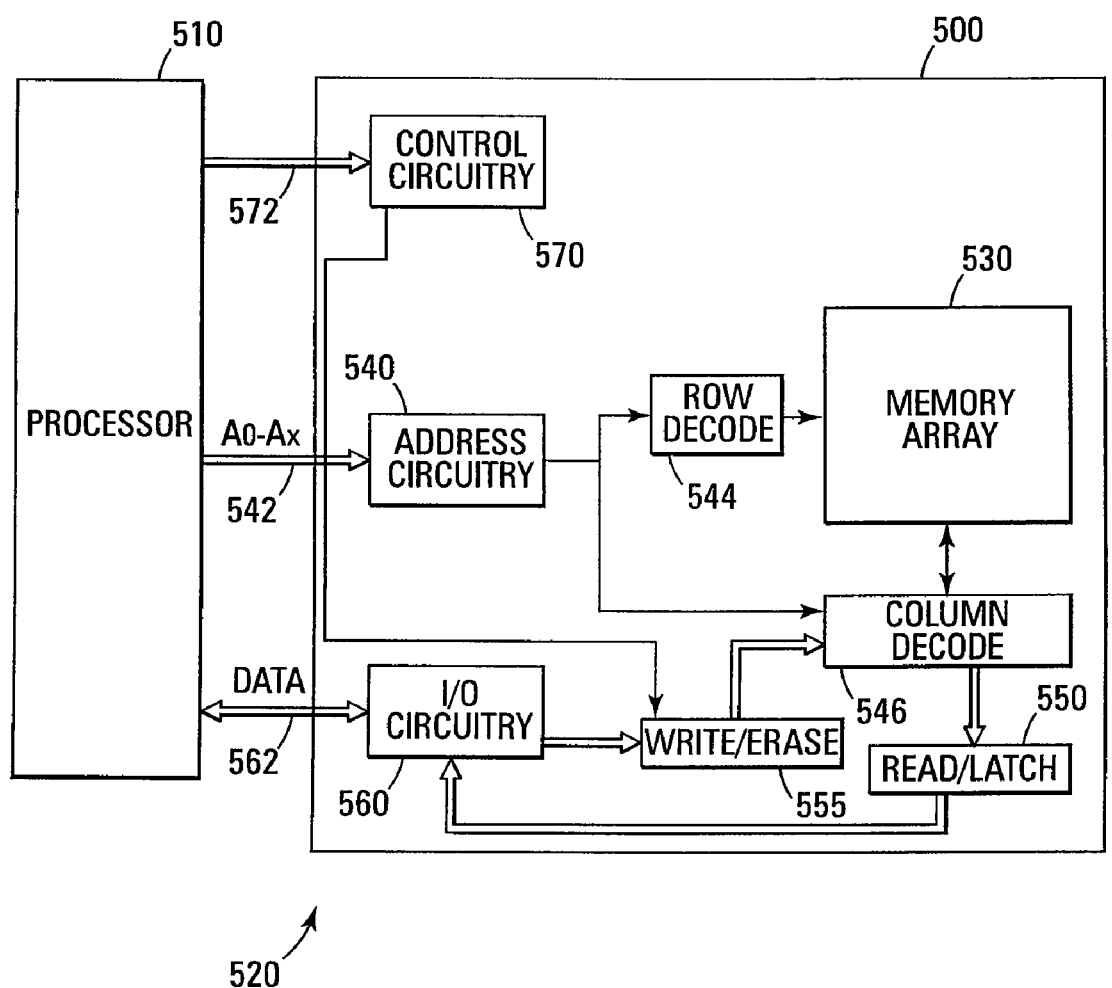
FIG. 5 shows a block diagram of one embodiment of an electronic system of the present invention.

FIG. 5 illustrates a functional block diagram of a memory device 500 that can incorporate the flash memory array with the lockable OTP block of the present invention. The memory device 500 is coupled to a processor 510. The processor 510 may be a microprocessor or some other type of controlling circuitry. The memory device 500 and the processor 510 form part of an electronic system 520. The memory device 500 has been simplified to focus on features of the memory that are helpful in understanding the present invention.

The memory device includes an array of flash memory cells 530 as described above with reference to FIG. 1. The memory array 530 is arranged in banks of rows and columns. The control gates of each row of memory cells is coupled with a wordline while the drain and source connections of the memory cells are coupled to bitlines. As is well known in the art, the connections of the cells to the bitlines determines whether the array is a NAND architecture or a NOR architecture.

An address buffer circuit 540 is provided to latch address signals provided on address input connections A0-Ax 542. Address signals are received and decoded by a row decoder 544 and a column decoder 546 to access the memory array 530. It will be appreciated by those skilled in the art, with the benefit of the present description, that the number of address input connections depends on the density and architecture of the memory array 530. That is, the number of addresses increases with both increased memory cell counts and increased bank and block counts.

The memory device 500 reads data in the memory array 530 by sensing voltage or current changes in the memory array columns using sense/buffer circuitry 550. The sense/buffer circuitry, in one embodiment, is coupled to read and latch a row of data from the memory array 530. Data input and output buffer circuitry 560 is included for bi-directional data communication over a plurality of data connections 562 with the controller 510. Write circuitry 555 is provided to write data to the memory array.

Control circuitry 570 decodes signals provided on control connections 572 from the processor 510. These signals are used to control the operations on the memory array 530, including data read, data write (program), and erase operations. The control circuitry 570 may be a state machine, a sequencer, or some other type of controller. In one embodiment, the control circuitry 570 is responsible for executing the embodiments of the OTP lock method of the present invention.

The flash memory device illustrated in FIG. 5 has been simplified to facilitate a basic understanding of the features of the memory. A more detailed understanding of internal circuitry and functions of flash memories are known to those skilled in the art.

CONCLUSION

In summary, the embodiments of the present invention provide a way to lock one time programmable areas of flash memory devices without additional circuitry to take up valuable real estate on the memory die. The OTP memory block, or other lockable areas, is user lockable with the present invention so that the user can store important data that is desired to be made unchangeable to consumers or other users. Once locked, the OTP memory block and the lock page/bits cannot be programmed or erased.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for locking a memory area of a memory device, the method comprising:
   performing a verify operation on at least one lock bit; and
   if the verify operation indicates that any bit of the at least one lock bit is programmed, inhibiting any further programming to all of the memory area.

2. The method of claim 1 wherein the memory area of the memory device is a predetermined one time programmable non-volatile memory block.

3. The method of claim 1 wherein performing the verify operation comprises checking if any of the at least one lock bits is programmed with a logical 0.

4. The method of claim 1 and further comprising:
   writing to the memory area until writing is complete;
   writing to the at least one lock bit when writing to the memory area is complete.

5. The method of claim 1 wherein determining the erase status includes performing an erase verify operation.

6. The method of claim 1 wherein the memory area of the non-volatile memory device is a one time programmable memory block of the memory array.

7. The method of claim 1 and further including preventing an erase operation to the memory area if the verify operation indicates that any bit of the at least one lock bits is programmed.

8. A method for locking a one time programmable memory block of a memory device, the method comprising:
   performing a verification of a lock page;
   programming to the memory block only if all memory cells of the lock page are erased; and
   writing at lease one bit to the lock page to lock the one time programmable memory block.

9. The method of claim 8 wherein the flash memory device comprises one of a NAND architecture or a NOR architecture.

10. The method of claim 8 and further comprising performing an erase operation on the one time programmable memory block if the verification of the lock page indicates that none of the lock page has been programmed.

11. The method of claim 8 and further including if any bit of the memory block is programmed, preventing any further program and erase operations to the one time programmable memory block.

12. A method for locking a memory area of a memory device, the method comprising:
   performing a verify operation on a lock page to check for a predetermined lock pattern; and
   inhibiting any further programming to all of the memory area when the predetermined lock pattern is detected.

13. The method of claim 12 wherein the memory area is comprised of a user space block.

14. The method of claim 12 wherein the memory area is comprised of a redundant memory block.

15. The method of claim 12 and further including inhibiting programming to a plurality of memory blocks in response to the predetermined lock pattern being detected.

16. The method of claim 12 and further including inhibiting programming to the memory device in response to the predetermined lock pattern being detected.

17. The method of claim 15 wherein the predetermined page is comprised of 16k data bits.

18. The method of claim 15 wherein the predetermined lock pattern is alternating logical ones and zeros.

19. The method of claim 18 wherein the alternating ones and zeros are programmed into page 0 of a one time programmable memory block to inhibit further programming of the memory block.

20. The method of claim 12 wherein inhibiting further programming comprises inhibiting further programming only if predetermined bits of the lock page are programmed with the predetermined lock pattern.

* * * * *

UNITED STATES PATENT AND TRADEMARK OFFICE
CERTIFICATE OF CORRECTION

| | |
|---|---|
| PATENT NO. | : 7,852,681 B2 |
| APPLICATION NO. | : 12/426689 |
| DATED | : December 14, 2010 |
| INVENTOR(S) | : Benjamin Louie et al. |

It is certified that error appears in the above-identified patent and that said Letters Patent is hereby corrected as shown below:

In column 6, line 17, in Claim 8, delete "lease" and insert -- least --, therefor.

Signed and Sealed this
First Day of March, 2011

David J. Kappos
*Director of the United States Patent and Trademark Office*